United States Patent [19]
Eguchi et al.

[11] Patent Number: 5,187,725
[45] Date of Patent: Feb. 16, 1993

[54] DATA DETECTOR AT OUTPUT OF COUNTER

[75] Inventors: Tadashi Eguchi, Yokohama; Satoshi Ishii, Tokyo, both of Japan

[73] Assignee: Canon Kabushiki Kaisha, Tokyo, Japan

[21] Appl. No.: 714,031

[22] Filed: Jun. 12, 1991

[30] Foreign Application Priority Data

Jun. 28, 1990 [JP] Japan .................. 2-171588

[51] Int. Cl.$^5$ .................. H03K 21/40; H03K 21/12
[52] U.S. Cl. .................. 377/56; 377/28; 377/114; 377/76
[58] Field of Search .............. 377/114, 115, 116, 117, 377/28, 55, 56, 54, 76, 72, 73

[56] References Cited

U.S. PATENT DOCUMENTS

| | | | |
|---|---|---|---|
| 2,956,181 | 10/1960 | Norman | 377/116 |
| 3,108,228 | 10/1963 | Clapper | 377/72 |
| 3,631,350 | 12/1971 | Drake | 377/116 |
| 4,519,091 | 5/1985 | Chu et al. | 377/44 |
| 4,741,005 | 4/1988 | Tanigawa | 377/115 |
| 4,789,959 | 12/1988 | Hung et al. | 377/28 |
| 4,796,095 | 1/1989 | Shimada | 377/76 |
| 4,825,439 | 4/1989 | Sakashita et al. | 377/54 |
| 4,881,248 | 11/1989 | Korechika | 377/56 |
| 5,060,243 | 10/1991 | Eckert | 377/28 |
| 5,062,126 | 10/1991 | Radys | 377/116 |

Primary Examiner—John S. Heyman
Attorney, Agent, or Firm—Fitzpatrick, Cella, Harper & Scinto

[57] ABSTRACT

A data detector comprises a counter having a plural-bit parallel output, compensation means for compensating a shift of output times of a low order bit and a high order bit of the counter caused by a carry signal from the low order bit to the high order bit, and detection means for detecting data of the low order bit and the high order bit of the counter compensated by the compensation means.

9 Claims, 4 Drawing Sheets

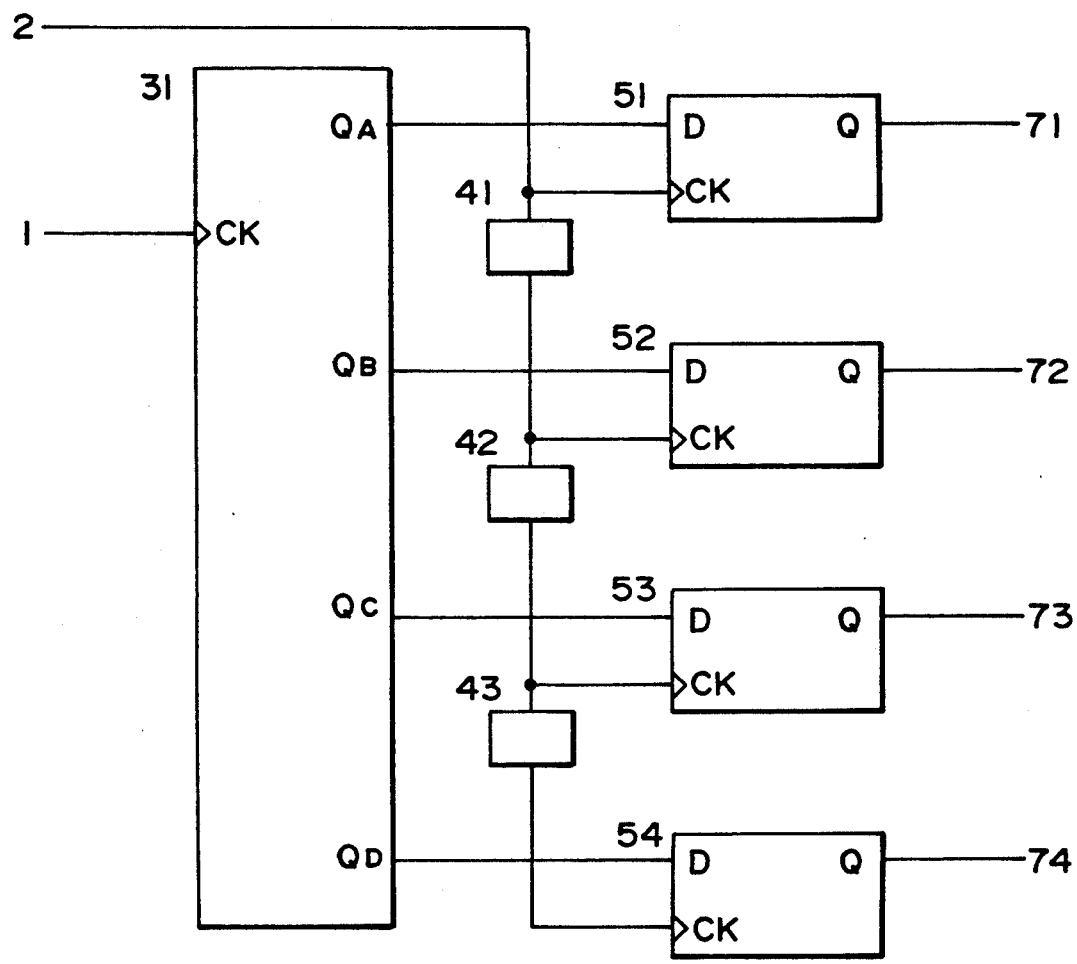
F I G. 1

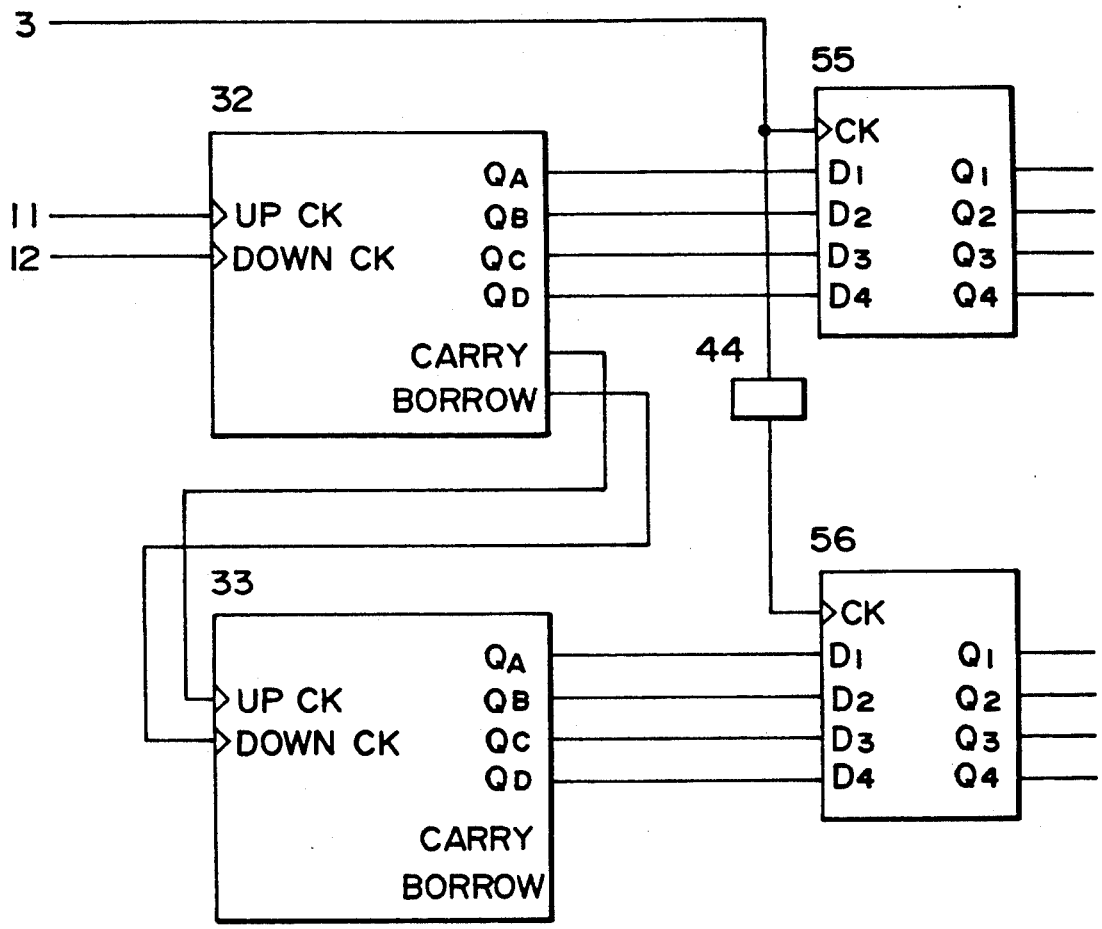
F I G. 3

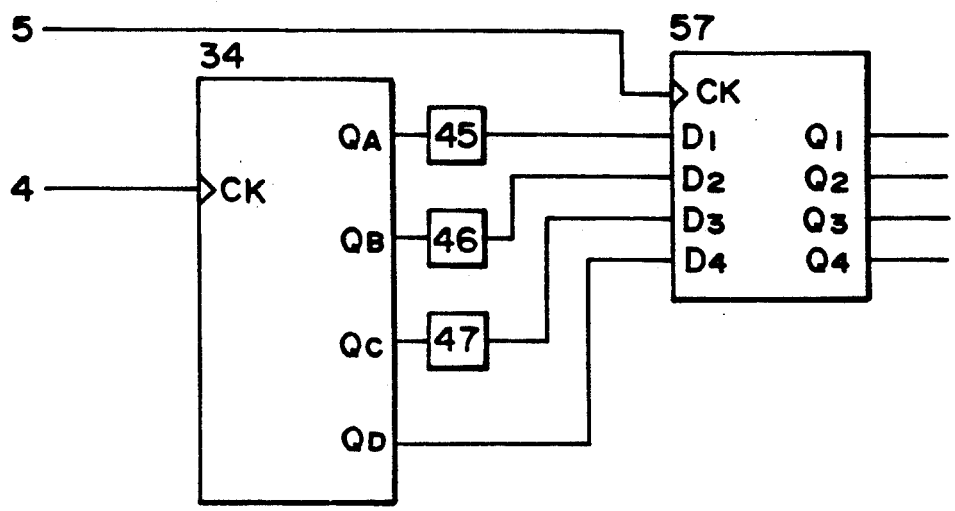
F I G. 4

DATA DETECTOR AT OUTPUT OF COUNTER

BACKGROUND OF THE INVENTION

1. Field of the Invention

The present invention relates to a data detector for a counter.

2. Related Background Art

In the past, when a clock signal is to be counted to detect data thereof, synchronous counters having a 4-bit output such as TTL 74LS169 and D flip-flops having a common clock such as TTL 74LS373 are usually used, as shown in FIG. 5, in which numeral 65 denotes a clock signal, numeral 66 denotes a latch signal, numerals 63 and 64 denote D flip-flops, and numerals 61 and 62 denote synchronous counters having a 4-bit output. A common clock is used for lower order and higher order synchronous counters 61 and 62, and a carry signal of the lower order counter 61 is used as an enable signal to the higher order counter 62.

However, where such synchronous counters are used, it is necessary that the carry signal serially goes through from the lower order to the higher order during the counted clock period. Therefore, as the number of stages increases, the countable frequency f count is lowered.

$$f\text{ count} = \frac{1}{t_{pd1} + (n - 2)t_{pd2} + t_{su}}$$

where $t_{pd1}$: Clock→ripple carry
$t_{pd2}$: Enable T→ripple carry
n: number of stages connected (number of IC's)

If a clock having a higher frequency than f count is applied, next clock is inputted before the high order bit is enabled. Therefore, it is not counted by the higher order counter and the carry to the high order bit is not effected. On the other hand, in an asynchronous counter, an input to one bit is an output from the immediately lower order bit. Accordingly, the high order bit is produced after the low order bit but no malfunction occurs unless a maximum frequency of the counter is exceeded. However, in the asynchronous counter, if data of the counter is detected in the course of carry from the low order bit to the high order bit, the data prior to the carry of the high order bit is detected.

SUMMARY OF THE INVENTION

In accordance with the present invention, a counter having a plural-bit output, means for compensating a low order bit/high order bit output time shift of the counter caused in carrying over from a low order bit to a high order bit of the counter, and means for detecting low order bit/high order bit data of the counter compensated by the compensation means, are provided to produce correct data even for a high speed clock.

Other objects of the present invention will be apparent from the description of the embodiment made with reference to the drawings.

BRIEF DESCRIPTION OF THE DRAWINGS

FIG. 1 shows a block diagram of a first embodiment of the present invention,

FIG. 3 shows a block diagram of a second embodiment,

FIG. 4 shows a block diagram of a third embodiment, and

DETAILED DESCRIPTION OF THE PREFERRED EMBODIMENTS

Embodiment 1

Figure 2:
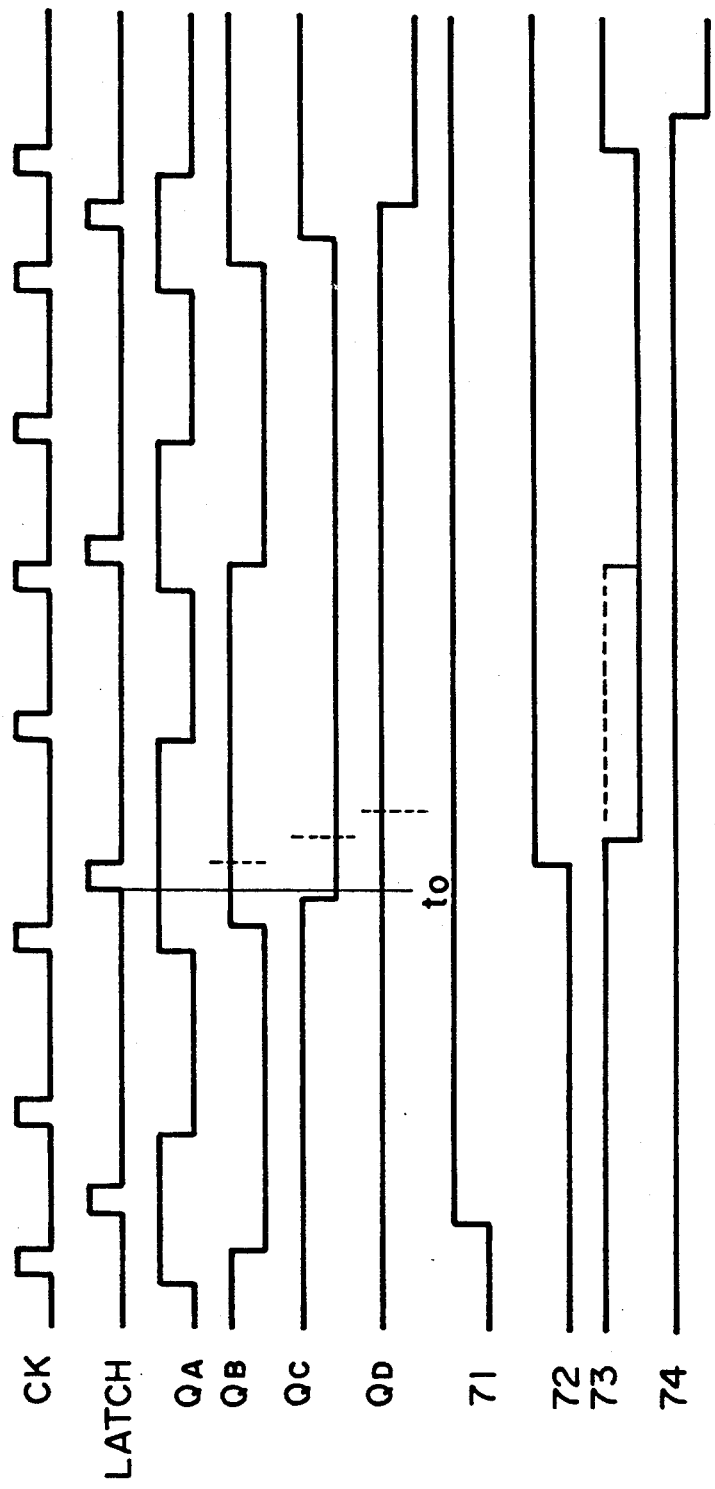
FIG. 2 shows a timing chart in FIG. 1.
Figure 5:
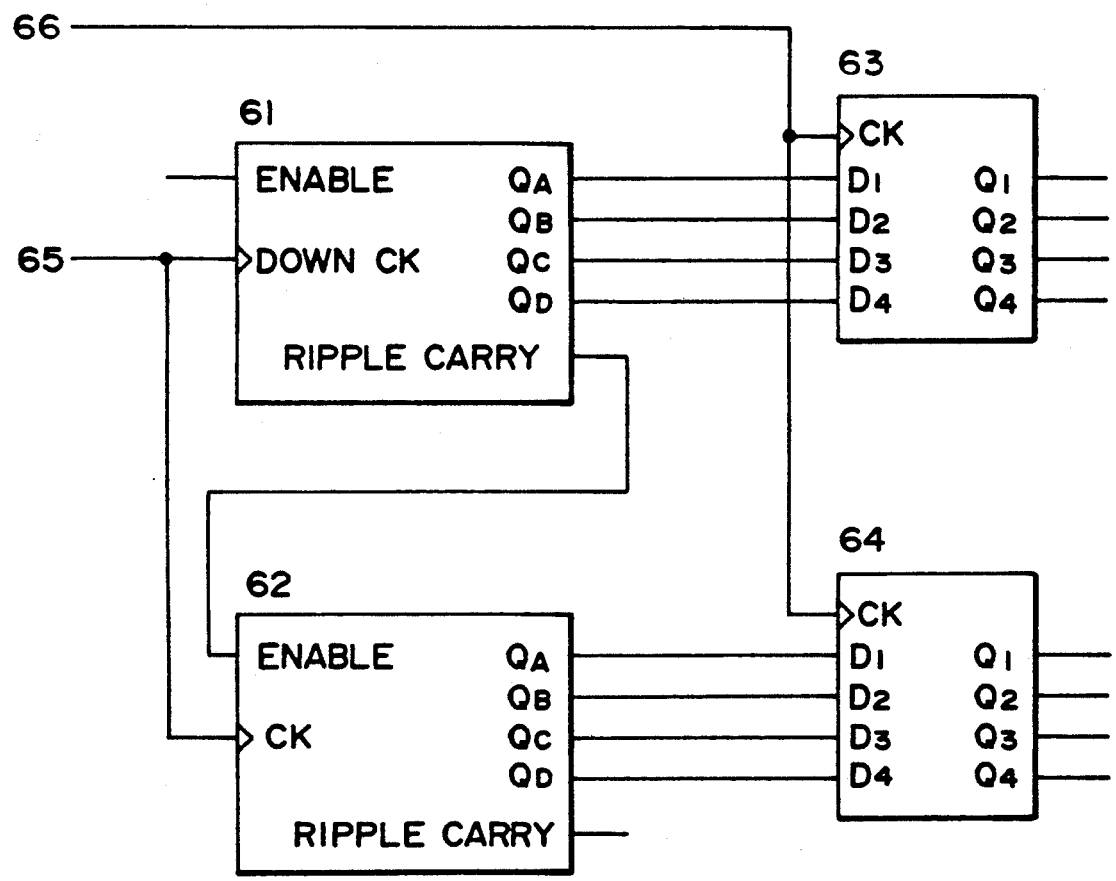
FIG. 5 shows a prior art circuit which uses a synchronous counter.

FIG. 1 shows one embodiment of the present invention. Numeral 1 denotes a clock signal, numeral 2 denotes a latch signal, numeral 31 denotes an asynchronous counter having a 4-bit output such as TTL 74LS93, numerals 41 to 43 denote delay lines for compensating delays in the bits of the counter 31, and numerals 51 to 54 denote D flip-flops such as TTL 74LS74 for latching the output of the counter 31. FIG. 2 shows a timing chart for the circuit of FIG. 1. When the latch signal is applied at a time $t_0$, the output of the D flip-flops does not represent a correct count "1011" at the time $t_0$ but it represents "1111" unless the delay lines 41 to 43 are inserted. If the delay times of the delay lines 41 to 43 are equal to differences of the output times between $Q_A$ and $Q_B$, $Q_B$ and $Q_C$, and $Q_C$ and $Q_D$ of the counter 31, the outputs of the D flip-flops 51 to 54 are delayed by the delay times so that the correct data is always outputted. (In the present embodiment, "1011")

Embodiment 2

FIG. 3 shows another embodiment of the present invention. Numeral 11 denotes an up-clock signal, numeral 12 denotes a down-clock signal, numeral 3 denotes a latch signal, numerals 32 and 33 denote partial synchronous counters having a 4-bit output such as 74LS193, and numerals 55 and 56 denote D flip-flops such as 74LS173. The partial synchronous counters 32 and 33 are in synchronism within the IC's but there is a time difference (a time difference from the application of an up/down-clock signal to the generation of a carry/borrow signal) between the outputs of the low order counter 32 and the high order counter 33 because the clock is transmitted through gates between the counters 32 and 33. In order to compensate for the time difference, a delay line 44 having the same delay time as the time difference is inserted to the clock (latch signal) of the D flip-flop 56. Thus, the counters 32 and 33 produce correct data.

Embodiment 3

FIG. 4 shows a further embodiment of the present invention. Numeral 4 denotes a clock signal, numeral 5 denotes a latch signal, numeral 34 denotes an asynchronous counter having a 4-bit output such as 74LS93, numerals 45 to 47 denote delay lines for compensating timings of the bit outputs of the counter 34, and numeral 57 denotes a D flip-flop such as 74LS173. The delay times of the delay lines 45 to 47 are selected to compensate the differences of the output times between $Q_D$ and $Q_A$, $Q_D$ and $Q_B$, and $Q_D$ and $Q_C$. Thus, the counter 34 operates like a synchronous counter and correct data is outputted by simultaneously latching the bit data. The same applies when the partially synchronous counter is used.

In the above three embodiments, the delay lines are used to delay the signals, although any devices which delay in time may be used.

In accordance with the present invention, the high speed and high capacity counting is attained. When a 32-bit counter is constructed by a fully synchronous type FAST-TTL counter IC (74F169), the countable frequency is 13.2 MHz while it is extended up to 80 MHz when it is implemented by a partially synchronous type FAST-TTL counter IC (74F193).

In accordance with the present invention, the counter having plural-bit output, means for compensating a shift of output times of the low bit and the high order bit of the counter caused by the carry signal from low order bit to the high order bit of the counter, and means for detecting the low and high order bit data of the counter compensated by the compensation means, are provided to attain the high speed counting.

We claim:

1. A data detector comprising:
   a counter having a plural-bit parallel output, wherein a low order bit and a high order bit output from said counter have a relative shift in respective output times caused by a carry signal from the low order bit to the high order bit;
   storage means connected to said counter having a plural-bit storage capacity for storing said bits outputted by said counter;
   instruction means connected to said storage means for instructing said storage means to store said bits therein at a storage timing; and
   compensation means connected to said storage means for compensating the instruction of said instruction means for said relative shift of output times of said bits.

2. A data detector according to claim 1 wherein said compensation means includes delay means.

3. A data detector according to claim 2 wherein said compensation means controls said storage timing of said storage means for storing the output bits of said counter by said delay means.

4. An information processing apparatus comprising:
   a first counter having plural-bit output;
   a second counter having plural-bit output, wherein data bits outputted from said first counter and data bits outputted from said second counter have a relative shift of respective output times corresponding to an output time of a carry signal from said first counter to said second counter;
   storage means connected to said first and second counters for storing said bits outputted from said first and second counters;
   instruction means connected to said storage means for instructing said storage means to store said bits therein at a storage timing; and
   compensation means connected to said storage means for compensating the instruction of said instruction means for said relative shift of output times of said bits.

5. An information processing apparatus according to claim 4 wherein said compensation means includes delay means and controls said storage timing of said storage means for storing the bits of said first counter and said second counter by said delay means.

6. An information processing apparatus according to claim 4 wherein said compensation means includes delay means for compensating the shift of the output time.

7. A data detector comprising:
   a counter having plural-bit parallel outputs, wherein a low order bit and a high order bit output from said counter have a relative shift in respective output times caused by a carry signal from the low order bit to the high order bit;
   means connected to all said outputs except a last output of said counter for compensating for said shift of output times of said bits; and
   storage means for simultaneously storing the data of the low order to high order bits of said counter as compensated by said compensation means.

8. A data detector according to claim 7 wherein said compensation means includes delay means for receiving said bits outputted from said counter and outputting said bits delayed by a predetermined time to said storage means.

9. A data detector according to claim 8 wherein said predetermined time is substantially the same delay time as a carry propagation time of each bit of said counter.

* * * * *